(12) United States Patent
Ueno et al.

(10) Patent No.: US 10,755,890 B2
(45) Date of Patent: Aug. 25, 2020

(54) CHARGED PARTICLE BEAM APPARATUS

(71) Applicant: Hitachi High-Tech Corporation, Minato-ku, Tokyo (JP)

(72) Inventors: Shinya Ueno, Tokyo (JP); Hiroshi Nishihama, Tokyo (JP); Shaungqi Dong, Tokyo (JP); Shahedul Hoque, Tokyo (JP); Susumu Koyama, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 15/940,868

(22) Filed: Mar. 29, 2018

(65) Prior Publication Data
US 2018/0286627 A1 Oct. 4, 2018

(30) Foreign Application Priority Data
Mar. 30, 2017 (JP) .................................. 2017-066631

(51) Int. Cl.
*H01J 37/147* (2006.01)
*H01J 37/20* (2006.01)
(Continued)

(52) U.S. Cl.
CPC ............ *H01J 37/147* (2013.01); *H01J 37/20* (2013.01); *H01J 37/22* (2013.01); *H01J 37/222* (2013.01);
(Continued)

(58) Field of Classification Search
CPC ................. H01J 37/28; H01J 2237/216; H01J 2237/2817; H01J 37/226; H01J 37/26;
(Continued)

(56) References Cited

U.S. PATENT DOCUMENTS 9,343,264 B2 * 5/2016 Kotaki ................. H01J 37/222
2002/0056808 A1 * 5/2002 Tsuneta ................. H01J 37/21
250/306
(Continued)

FOREIGN PATENT DOCUMENTS

JP 2010-272398 A 12/2010
JP 5313069 B2 10/2013

*Primary Examiner* — David A Vanore
(74) *Attorney, Agent, or Firm* — Crowell & Moring LLP

(57) ABSTRACT

An object of the invention is to provide a charged particle beam apparatus capable of achieving both acquisition of an image having high resolution of an inspection target pattern and suppression of a beam irradiation amount when a specific pattern is an inspection target from a highly integrated pattern group. In order to achieve the object, a charged particle beam apparatus is proposed in which at least one of a stage and a deflector is controlled so as to move a field of view from a reference position to an inspection or measurement target pattern, the number of objects included in a first image obtained by scanning a position of the field of view in a moving process of the field of view with a charged particle beam of a first irradiation condition is counted, and in a case where the number of the objects satisfies a predetermined condition, a second image is generated based on scanning with a charged particle beam of a second irradiation condition of a higher dose than that of the first irradiation condition.

7 Claims, 12 Drawing Sheets

(51) Int. Cl.
*H01J 37/26* (2006.01)
*H01J 37/28* (2006.01)
*H01J 37/22* (2006.01)

(52) U.S. Cl.
CPC .......... *H01J 37/261* (2013.01); *H01J 37/265* (2013.01); *H01J 37/28* (2013.01); *H01J 2237/20285* (2013.01)

(58) Field of Classification Search
CPC ....... H01J 2237/1205; H01J 2237/1501; H01J 2237/20207; H01J 2237/20221; H01J 2237/208; H01J 2237/221; H01J 2237/24475; H01J 2237/2448; H01J 2237/2482; H01J 2237/2487; H01J 2237/2605; H01J 2237/2804; H01J 2237/30461; H01J 2237/31745; H01J 2237/31749; H01J 37/20; H01J 37/21; H01J 37/222; H01J 37/244; H01J 37/263; H01J 37/265; H01J 37/3005; G01N 2458/15; G01N 33/543; G01N 33/54373; G01N 33/587; H01L 2924/0002; H01L 2924/00; H01L 22/12
USPC ........................ 250/307, 310, 306, 309, 311
See application file for complete search history.

(56) References Cited

U.S. PATENT DOCUMENTS

| | | | | |
|---|---|---|---|---|
| 2003/0201393 | A1* | 10/2003 | Tsuneta | H01J 37/26 250/311 |
| 2005/0244821 | A1* | 11/2005 | Zik | G01N 33/543 435/6.12 |
| 2007/0274593 | A1* | 11/2007 | Tsuneta | G06T 7/0004 382/192 |
| 2012/0104253 | A1* | 5/2012 | Tsuneta | H01J 37/20 250/307 |
| 2015/0262786 | A1* | 9/2015 | Nakai | H01J 37/226 216/95 |
| 2016/0163504 | A1* | 6/2016 | Takeda | H01J 37/244 250/307 |

* cited by examiner

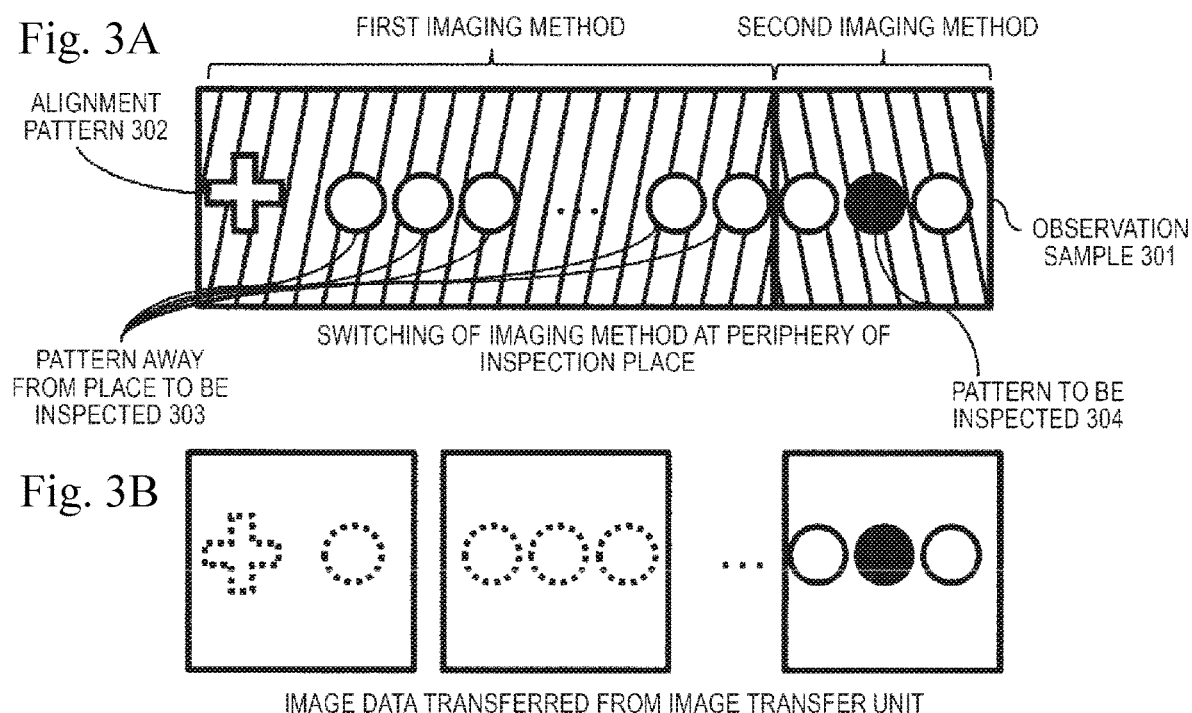

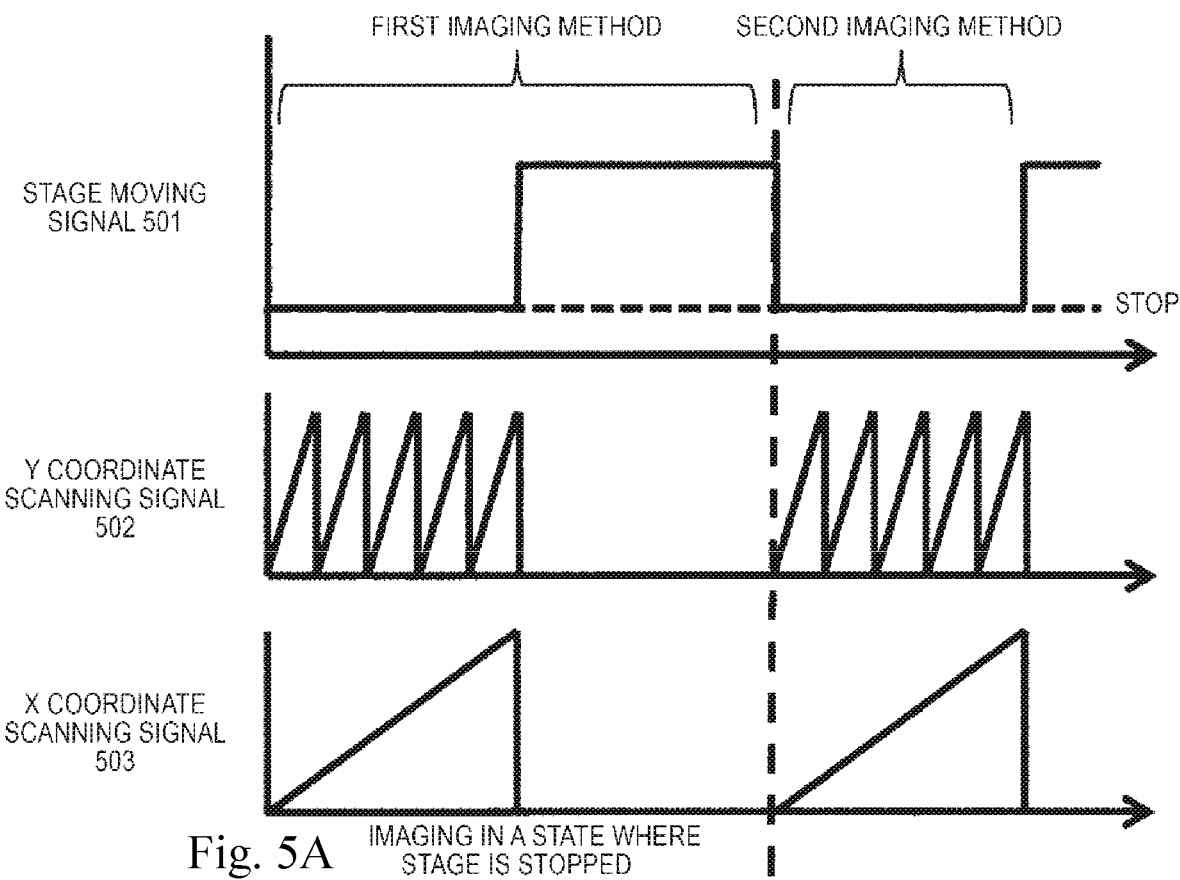
Fig. 5A  IMAGING IN A STATE WHERE STAGE IS STOPPED
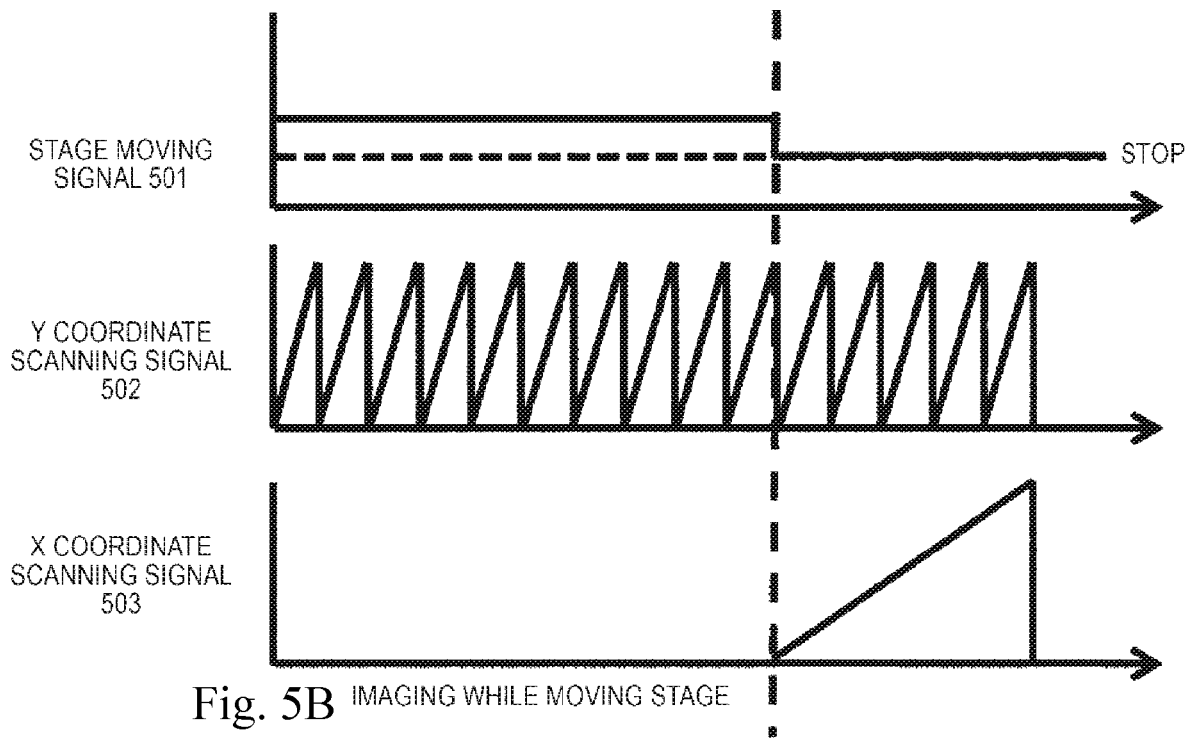
Fig. 5B  IMAGING WHILE MOVING STAGE

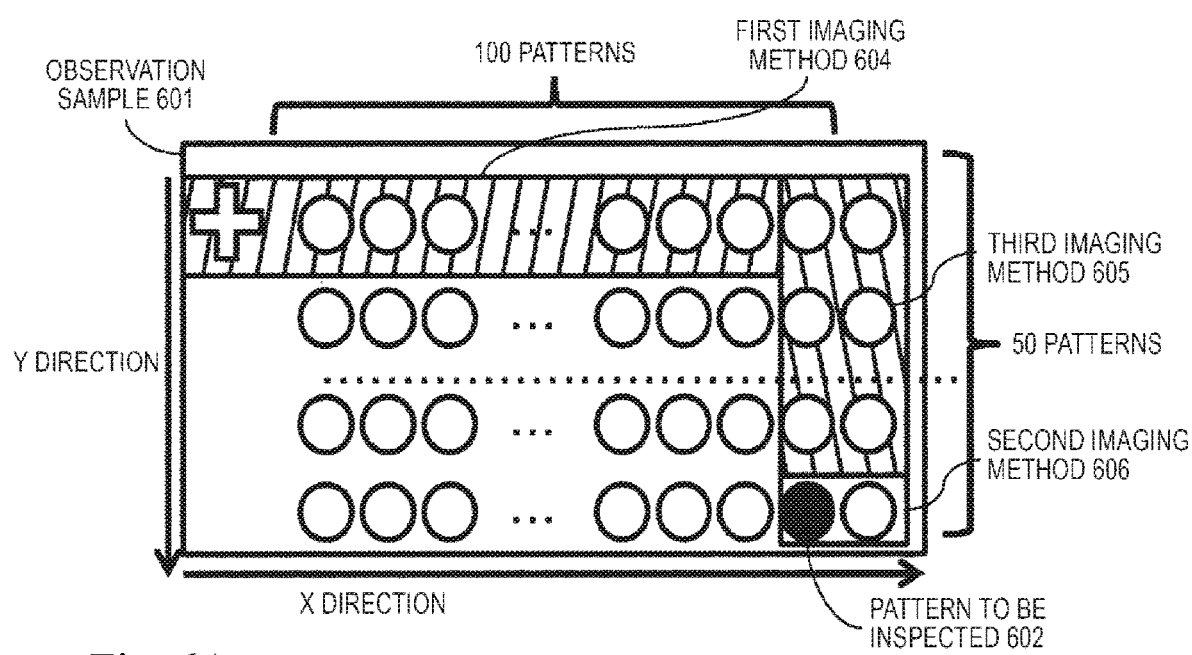
Fig. 6A SCANNING WITH PLURALITY OF CONDITIONS AND THREE KINDS OF IMAGING METHODS
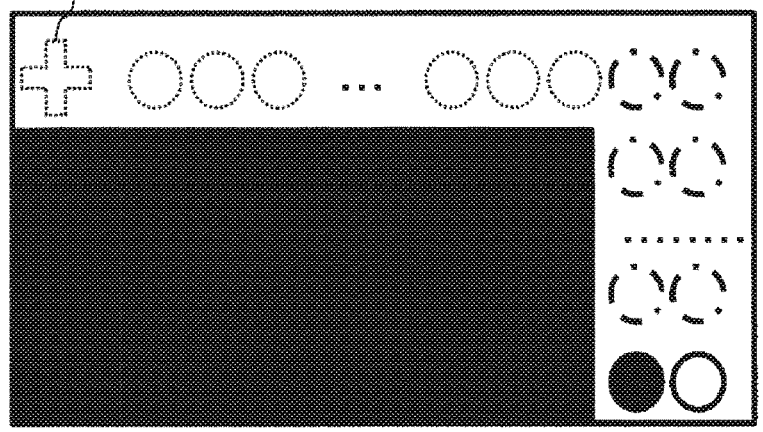
Fig. 6B OUTPUT IMAGE Fig. 11A PITCH ABNORMALITY BETWEEN PATTERNS
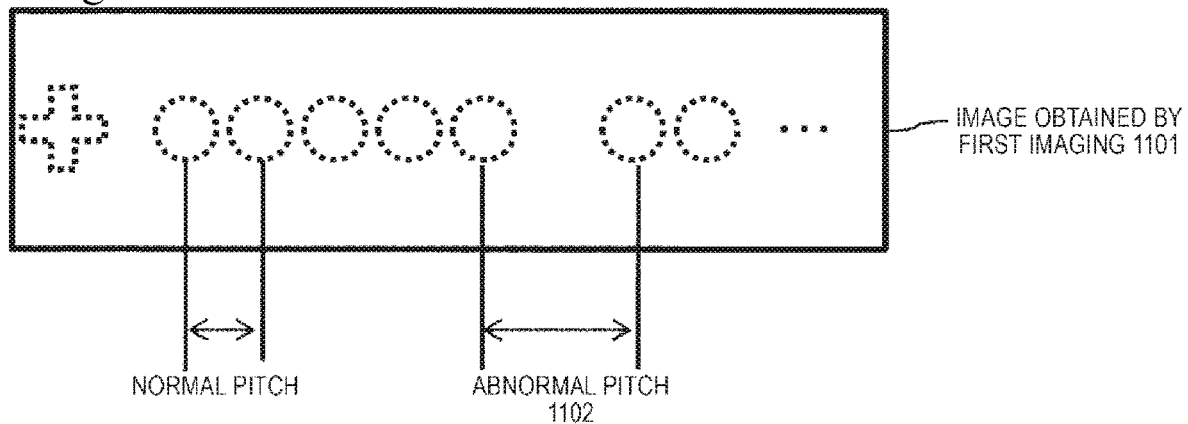
NORMAL PITCH   ABNORMAL PITCH
1102
Fig. 11B DEVIATION OF PATTERN POSITION
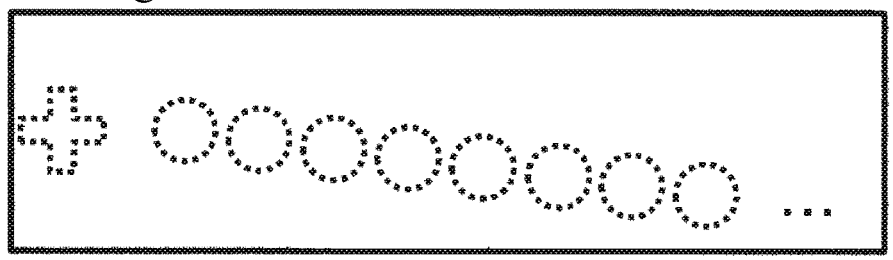

CHARGED PARTICLE BEAM APPARATUS

TECHNICAL FIELD

The present disclosure relates to a charged particle beam apparatus, and more particularly to a charged particle beam apparatus capable of searching an object that is an evaluation target while suppressing an influence by irradiating a sample with a charged particle beam.

BACKGROUND ART

A scanning kind electron microscope that is a kind of a charged particle beam apparatus is an apparatus that irradiates an observation sample, for example, a circuit pattern of a semiconductor wafer with an electron beam and detects emission electrons such as secondary electrons generated from the observation sample to acquire an observation image of the observation sample. In the scanning kind electron microscope, an image is generated by arranging detection signals obtained by irradiating a surface of the observation sample with a narrowed primary electron beam while two-dimensionally scanning the surface in synchronization with a scanning signal of the beam.

PTL 1 discloses a scanning electron microscope in which when scanning a range of a field of view including an observation target pattern in order to suppress shrinkage of an observation target caused by beam irradiation, an irradiation amount of a surrounding region of the observation target pattern is suppressed relative to an irradiation amount to the observation target pattern so that a beam irradiation amount over an entire field of view is suppressed.

PTL 2 discloses a panorama image synthesizing technique for dividing a region to be imaged into a plurality of regions and joining a high-resolution image acquired in each of the divided regions in order to acquire a high-resolution image over a wide range.

CITATION LIST

Patent Literature

PTL 1: JP-A-2010-272398
PTL 2: Japanese Patent No. 5313069 (corresponding to U.S. Pat. No. 9,343,264)

SUMMARY OF INVENTION

Technical Problem

In a case where patterns having the same shape are periodically arranged like a hole pattern of a memory formed on a semiconductor wafer, if no alignment pattern or the like for specifying a position is shown in an image acquired using the scanning kind electron microscope, it is difficult to grasp which number of patterns is measured or inspected (hereinafter, sometimes simply referred to as inspected). Therefore, in order to perform inspection while identifying the position of the pattern, it is desirable to acquire an image, in which a relative positional relationship between an alignment pattern and an inspection target pattern is determined.

On the other hand, when a sample surface is irradiated with the primary electron beam, the observation target pattern may be shrunk depending on an irradiation time and intensity of the primary electron beam. Therefore, it is desirable to reduce the beam irradiation amount to the observation sample as much as possible.

According to the technique disclosed in PTL 1, it is possible to reduce the beam irradiation amount (dose amount) in the field of view while maintaining the image quality at a periphery of the inspection target pattern in a high image quality state, however, due to recent high integration of semiconductor pattern, it is difficult to include the alignment pattern and the inspection target pattern in one field of view.

On the other hand, as in the technique disclosed in PTL 2, an image group acquired in a plurality of imaging regions is synthesized while moving the field of view to create a panorama image, so that even if a pattern is located far from the alignment pattern, it is possible to accurately locate and inspect the pattern. However, in order to join images of adjacent image regions, a highly accurate image is required, so the irradiation amount of the electron beam is increased and an execution speed also becomes slow.

Hereinafter, a charged particle beam apparatus is proposed which aims at achieving both acquisition of an image having high resolution of an inspection target pattern and suppression of a beam irradiation amount when a specific pattern is an inspection target from a highly integrated pattern group.

Solution to Problem

As an aspect to achieve the object, a charged particle beam apparatus is proposed which includes a deflector that deflects a charged particle beam emitted from a charged particle source; a stage that moves a sample that is an irradiation target of the charged particle beam; and a control device that controls the deflector and the stage. The control device controls at least one of the stage and the deflector so as to move a field of view from a reference position to an inspection or measurement target pattern, counts the number of objects included in a first image obtained by scanning a position of the field of view in a moving process of the field of view with a charged particle beam of a first irradiation condition, and in a case where the number of the objects satisfies a predetermined condition, generates a second image based on scanning with a charged particle beam of a second irradiation condition of a higher dose than that of the first irradiation condition.

Advantageous Effects of Invention

According to the configuration described above, it is possible to search a desired pattern and acquire a high-resolution image of a pattern specified by searching while suppressing a beam irradiation amount.

BRIEF DESCRIPTION OF DRAWINGS

FIGS. 3A to 3C are views illustrating an example of a synthesized image of an image obtained based on low dose beam scanning and an image obtained based on high dose beam scanning.

FIGS. 5A and 5B are time charts illustrating a temporal relationship between a stage moving signal and a scanning side of a beam.

FIGS. 6A and 6B are views illustrating an example of a synchronized image of an image obtained by changing a scanning method in three stages from a reference pattern to an inspection target pattern.

FIGS. 11A and 11B are views illustrating an example of a pattern search image of a sample of which a pattern pitch varies and a sample of which a pattern position gradually changes.

DESCRIPTION OF EMBODIMENTS

Figure 1:
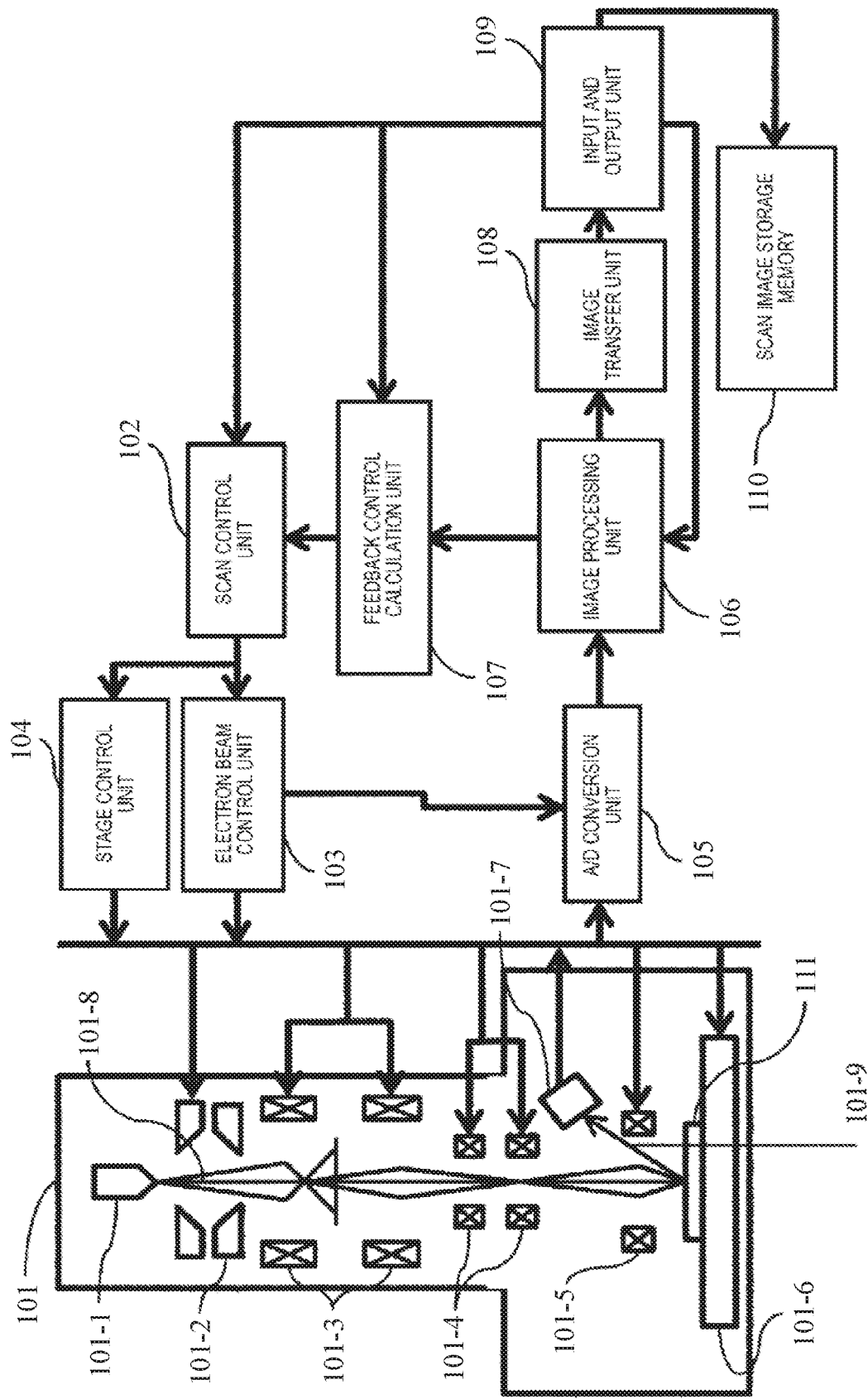
FIG. 1 is a diagram illustrating a configuration of a scanning electron microscope.

Hereinafter, a charged particle beam apparatus, which is capable of performing specification of an inspection target pattern and highly accurate measurement or inspection of the inspection target pattern while suppressing a beam irradiation amount with respect to a sample, will be described. By suppressing the beam irradiation amount, it is possible to suppress shrinkage of an observation sample and speed up the inspection.

In examples described below, a reference pattern such as an alignment pattern is set as a reference. In a case where, for example, an $n^{th}$ pattern viewed from the reference pattern that is an inspection target is searched, and beam irradiation is performed for the inspection, the beam irradiation is performed on a repetitive pattern that is positioned between the reference pattern and the inspection target pattern under a first irradiation condition having lower dose than that of a second irradiation condition when the inspection target pattern is irradiated with a beam. The number of patterns included in an image obtained by the beam irradiation of the first irradiation condition or the like is obtained. When the number of the patterns satisfies a predetermined condition (for example, when the number of the patterns is n−1, or n), a high-resolution image is acquired for the inspection target pattern while suppressing a total beam irradiation amount by irradiating a next field of view or the field of view with a beam under the second irradiation condition. In the following description, an example of counting the number of the patterns will be described. However, another counting target (object) capable of specifying a desired $m^{th}$ pattern such as the number of edges may be counted.

For example, in a charged particle application apparatus such as the scanning kind electron microscope, an image is acquired by a first imaging method with a relatively low dose and an image process is performed with respect to the acquired image to determine whether or not a condition designated by a user is satisfied. As a result of the determination, if the condition is not satisfied, a scanning region is moved and imaging is performed by the same method. As a result of the determination, in a case where the condition is satisfied, a second imaging method of a higher dose is switched to the method.

According to the configuration described above, a pattern kind and presence or absence of a defect on a sample are recognized with respect to a continuous scanning region from the alignment pattern by using the image imaged by the first imaging method, it is determined whether or not the condition coincides with the condition designated by the user from the result thereof, and the second imaging method of higher dose than that of the first imaging method is selected to perform scanning. Therefore, the user can recognize the position of the inspection target at a glance and at the same time, can acquire a detailed inspection result of the inspection target.

According to the configuration described above, the search of an inspection pattern, which is located at a position far away from the alignment pattern and cannot be coexisted in a high-magnification image, can be performed with a low-dose beam which can suppress an influence of shrinkage and charging, and it is possible to realize compatibility between a high speed search and high-resolution image inspection.

The inventors recall a new control method in which a searching step of a pattern is performed based on low-dose beam irradiation, and when a field of view reaches a pattern that is an inspection target, the low-dose beam is switched to a high-dose beam, based on new finding that an image and a signal waveform for determining a presence of a pattern may be relatively low image quality and a low S/N with respect to an image and a signal waveform used for highly accurate inspection and measurement. Hereinafter, more specific examples will be described with reference to the drawings.

Example 1

Hereinafter, a scanning kind electron microscope that is an aspect of a charged particle beam apparatus will be described as an example, but may also be applied to another charged particle beam apparatus such as a focused ion beam apparatus.

FIG. 1 is a diagram illustrating an example of the scanning electron microscope. A scanning kind electron microscope system illustrated in FIG. 1 includes an electron microscope 101, a scan control unit 102, an electron beam control unit 103, a stage control unit 104, an A/D conversion unit 105, an image processing unit 106, a feedback control calculation unit 107, an image transfer unit 108, an input and output unit 109, and a scan image storage memory 110.

An inside of the electron microscope 101 includes an electron source 101-1, an acceleration electrode 101-2, a focusing lens 101-3, a deflection coil 101-4, an objective lens 101-5, a stage 101-6, and a detector 101-7.

Electrons extracted by an extraction electrode from the electron source 101-1 are accelerated by the acceleration electrode 101-2 and becomes a primary electron beam 101-8, and an observation sample 111 is irradiated with the primary electron beam 101-8. The acceleration electrode 101-2 accelerates the electrons extracted from the electron source 101-1 toward the observation sample 111 along a beam optical axis. The focusing lens 101-3 converges the primary electron beam 101-8 accelerated by the acceleration electrode 101-2. The deflection coil 101-4 deflects the primary electron beam 101-8 converged by the focusing lens 101-3 and the observation sample 111 is two-dimensionally scanned with the primary electron beam 101-8.

The objective lens 101-5 converges the primary electron beam 101-8 deflected by the deflection coil 101-4 on the observation sample 111 as a minute spot. The observation sample 111 is placed on the stage 101-6 and the observation sample 111 is two-dimensionally moved based on a control signal from the stage control unit 104. The detector 101-7 detects emission electrons 101-9 such as secondary electrons or reflection electrons emitted from the observation sample 111 based on irradiation of the observation sample 111 with the primary electron beam 101-8. In addition, a detection method for detecting the secondary electrons or the like generated from the electrode based on collision of the electrons emitted from the observation sample 111 with the electrode.

The scan control unit 102 generates electron beam control information necessary for two-dimensional scanning with the primary electron beam 101-8 and transmits the electron beam control information to the electron beam control unit 103. Therefore, the scan control unit 102 generates stage control information and transmits the stage control information to the stage control unit 104. The electron beam control unit 103 generates a deflection control signal for two-dimensional scanning the primary electron beam 101-8 on the observation sample 111 and supplies the deflection control signal to the deflection coil 101-4. Therefore, the electron beam control unit 103 supplies a sampling clock for digitizing a detection output of the detector 101-7 to the A/D conversion unit 105.

The stage control unit 104 generates a control signal for two-dimensionally moving the stage 101-6. The A/D conversion unit 105 converts an analog signal output from the detector 101-7 into a digital signal. The image processing unit 106 converts the digital signal into image data, transmits the image data to the image transfer unit 108, and at the same time, performs image processing to transmit information such as presence or absence of a defect in an image, and the number of patterns to the feedback control calculation unit 107.

The feedback control calculation unit 107 compares a result of the image process with a condition for changing an imaging method, and transmits presence or absence of a change in the imaging method to the scan control unit 102. The image transfer unit 108 temporarily holds the image data output from the image processing unit 106, performs a process using a plurality of image data such as integration of the same pixels, and transmits a result thereof to the input and output unit 109. The input and output unit 109 includes an input device such as a keyboard or a pointing device for inputting an instruction of the imaging method, an imaging method changing condition, or the like, and a monitor for outputting a Graphical User Interface (GUI), various data, or the like on On Screen Display (OSD). The scan image storage memory 110 can store the image data of the scan result and output any data to the input and output unit 109.

Figure 2:
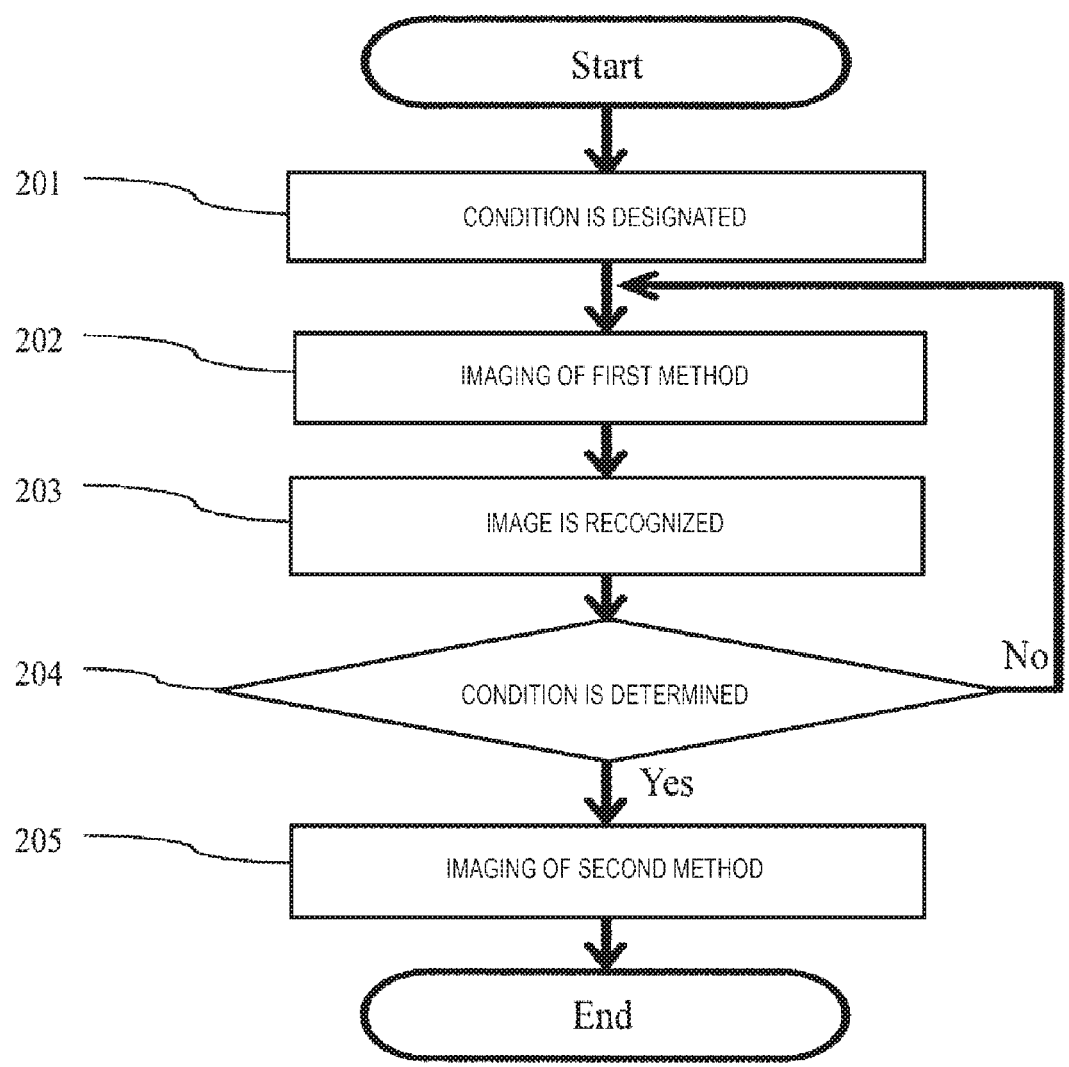
FIG. 2 is a flowchart illustrating steps of performing pattern search with an image obtained based on low dose beam scanning, and performing measurement or inspection of a pattern based on a signal obtained based on high dose beam scanning.

A flow of inspection in the example will be described with reference to FIG. 2. In condition designating step 201, a user performs designation of a condition using the input and output unit 109 (input device). This is a step of inputting the imaging method and a condition for searching a place to be searched. In the next imaging step 202 of a first method, acquisition of an image is executed by the first imaging method designated by the user with the scanning kind electron microscope. In image recognition step 203, the image process is performed with respect to the image acquired in the previous step and calculation for determining a condition for searching a place to be inspected which is designated in the condition designating step 201 is performed.

In condition determining step 204, it is determined whether or not a result calculated in the image recognition step 203 satisfies the condition for searching the place to be inspected which is designated in the condition designating step 201. If the condition is not satisfied, the process returns to the imaging step 202 of the first method. If the condition is satisfied, the process proceeds to imaging step 205 of a second method. In the second imaging method, the observation sample 111 is imaged by the second imaging method of higher dose than that of the first imaging method. An accurate position from an alignment pattern of a place to be inspected and an accurate inspection result with a high speed and a reduced amount of an electron beam irradiation are achieved by connecting the images obtained by the first imaging method and the second imaging method.

Next, a flow of the inspection described with reference to FIG. 2 will be described in detail. Image acquisition of an observation target is performed based on the imaging method and a change condition of the imaging method set by the user using the input and output unit 109. The GUI for designating the first imaging method, the second imaging method, and the change condition of the imaging method is displayed on a monitor of the input and output unit 109 at a start of the acquisition process. An operator inputs various imaging conditions (for example, an acceleration voltage, a probe current, an imaging magnification, a pixel integration number (number of frames), and a scanning direction of the electron beam), imaging method changing conditions (for example, presence or absence of a defect, designation of a kind and the number of patterns to be counted, a height change of a pattern, and the like), and inspection information such as an observation place of the observation sample 111 using the GUI via the input device of the input and output unit 109.

The acquisition process of the observation image is performed based on the input information and image data acquisition of the observation place in the observation sample 111 placed on the stage 101-6 is performed as follows.

Based on the first imaging method input by the input and output unit 109, two-dimensional scanning information of the electron beam is dispatched from the scan control unit 102 to the electron beam control unit 103 and information such as a stage moving speed, a stage moving direction, and stage coordinate information of a stage moving destination is dispatched to the stage control unit 104. In each of the electron beam control unit 103 and the stage control unit 104, a control signal is generated based on the information received. The electron beam emitted from the electron source 101-1 inside of the electron microscope is accelerated by the acceleration electrode 101-2, is converged by the focusing lens 101-3, is deflected by the deflection coil 101-4 based on the control signal of the electron beam control unit 103, is converged on the observation sample 111 by the objective lens 101-5, and irradiates the observation place of the observation sample 111.

The observation sample 111 is two-dimensionally scanned with the primary electron beam 101-8 while controlling two-dimensional scanning with the electron beam by the electron beam control unit 103 and controlling a two-dimensional movement of the stage 101-6 by the stage control unit 104. The emission electron 101-9 such as reflected electrons and secondary electrons is emitted from a surface of the observation sample 111 by the primary electron beam 101-8, with which the observation sample 111 is irradiated, is detected by the detector 101-7, and is converted into an analog signal. The converted analog signal is converted into a digital data by the A/D conversion unit 105 and is image-digitalized by the image processing unit 106.

A feedback process to the scan control unit 102 is performed as follows based on the image data and the input information of the input and output unit 109. In a case where the information input in the input and output unit 109 is, for example, an instruction for inspecting a $100^{th}$ hole pattern from the alignment pattern, a process for recognition of the number of the hole patterns included in the image data is performed by the image processing unit 106. The recognition result, that is, the number of the hole patterns included in the image data is transmitted to the feedback control calculation unit 107. In the example, a condition for the feedback control calculation unit 107 to switch to the second imaging method is "the $100^{th}$ hole pattern is included in the image data to be acquired next".

The feedback control calculation unit 107 determines whether or not the $100^{th}$ hole pattern is included at the next image acquisition by adding the number of the hole patterns counted so far and the number of the hole patterns included in one image data. In a case where the condition is not satisfied, the next image acquisition is performed without switching the imaging method. In a case where the condition is satisfied, the feedback control calculation unit 107 instructs the scan control unit 102 to switch the scanning method, and acquires an image by the second imaging method.

An image output to the input and output unit 109 is processed as follows using an image transmitted from the image processing unit 106 to the input and output unit 109 through the image transfer unit 108 and the image of the scan image storage memory 110.

The image data generated by the image processing unit 106 is transmitted to the image transfer unit 108. The image data generated by the first imaging method is transferred to the input and output unit 109 as it is and is stored in the scan image storage memory 110. In a case where a process using a plurality of the images such as integration of the same pixel by the second imaging method is performed, the image data is temporarily stored in the image transfer unit 108 and a process is performed by using image data which is transmitted later.

When the number of calculations reaches the number set by the second imaging method, the image data is transferred to the input and output unit 109 and is stored in the scan image storage memory 110. Since the image data transmitted from the image transfer unit 108 are each adjacent image data, a panorama image of the observation sample 111 as illustrated in FIG. 3(*c*) can be obtained by arranging the image data in the order of transfer.

In the example, as illustrated in FIG. 3(*a*), images of an alignment pattern 302 (pattern for alignment) provided at a reference position on an observation sample 301 and images of patterns 303, which are positioned between the alignment pattern 302 and a pattern 304 to be inspected and far from the place to be inspected, are generated based on the scanning of the first imaging method (first irradiation condition). When patterns are counted using the image obtained by the first imaging method and the patterns reaches a predetermined number, the method is switched to the second imaging method (second irradiation condition) of a relatively high dose with respect to that of the first imaging method and an inspection image is acquired by performing beam scanning. Specifically, only the image data of the periphery of the pattern 304 to be inspected is acquired by the second imaging method. As illustrated in FIG. 3(*b*), a plurality of images are obtained by performing such scanning. As illustrated in FIG. 3(*c*), entire images from the alignment pattern 302 to the pattern 304 to be inspected can be acquired by arranging the order of the images transferred from the image transfer unit 108 and only images at the periphery of the pattern 304 to be inspected become images with high accuracy.

After an image including the pattern 304 to be inspected is acquired, luminance information (line profile) of the image is extracted and a pick-to-pick distance of a profile waveform is measured, for example, thereby outputting a line width of a pattern, a diameter of a hole, or the like.

Moreover, in order to count the pattern, pattern recognition (pattern matching) is performed by using a previously registered template image and the number of patterns reaching the pattern 304 may be counted by counting the number of places where a predetermined matching score is obtained.

In addition, as switching from the first imaging method to the second imaging method, for example, a method of switching from a state where the number of scanning lines per frame is small to a state where the number thereof is large can be considered. For example, in a case where the number of the scanning lines required for inspection is 1024, images for pattern counting are reduced to half of 512, or to ¼ of 256. Therefore, it is possible to realize the images required for the pattern count to be low dose. As the number of the scanning lines is small, the image for the pattern count becomes relatively coarse with respect to the inspection image, but an image of a certain degree which can recognize presence or absence of the pattern by the image process may be obtained. Moreover, in order to generate an image with small scanning lines with respect to the inspection image, for example, it is conceivable to delete the every other scanning line by blanking.

Furthermore, as switching from the first imaging method to the second imaging method, it is conceivable to switch from a state where a scanning speed is fast to a state where the scanning speed is slow, or from a state where the number of frames is small to a state where the number thereof is large. In a case where the number of the frames is switched, it is conceivable that after a field of view reaches an inspection target pattern, scanning is repeated for the number of frames of shortage. More specifically, in a case where the number of the frames for acquiring the image for the pattern count is 2 frames and the number of the frames for acquiring the inspection image is 8 frames, after 2 frames are scanned and after it is determined that there is the inspection target pattern in the field of view, a signal of 8 frames may be acquired by adding scanning of 6 frames.

Moreover, in the example of FIG. 3, an example, in which a plurality of the images acquired by the first imaging method are continuous adjacent images having different fields of view, is described, but an overlapping region between images is provided and the overlapping regions may be overlapped to perform image synthesis.

In addition, it is also possible to move the field of view, for example, by using the movement of the field of view using a deflector for the movement of the field of view without performing the movement of the field of view by the stage, or using both the stage and the deflector for the movement of the field of view.

Example 2

Next, a scanning electron microscope including a search algorithm for searching the inspection target pattern by using a scanning method suitable for the pattern count will be described.

Figure 4A:
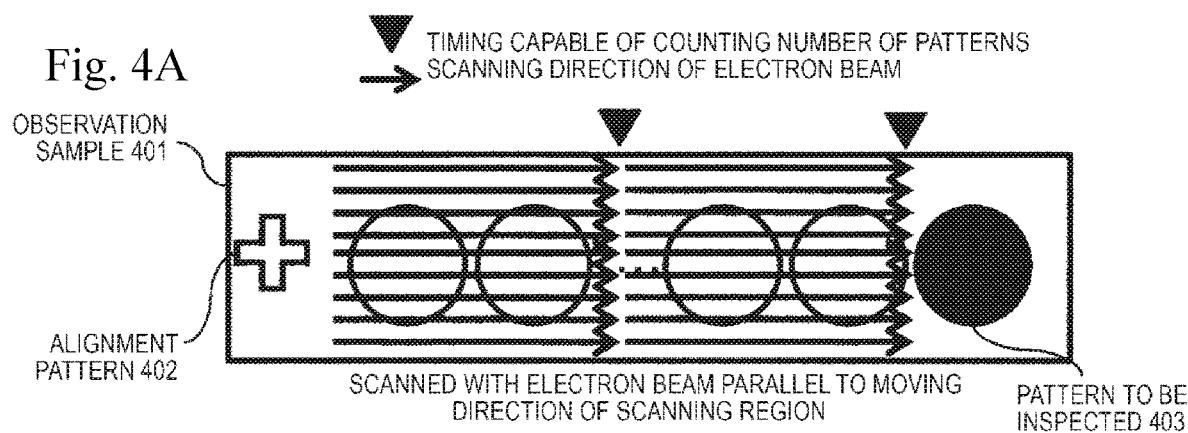
FIGS. 4A to 4C are views for explaining an example in which a scanning method of an electron beam is changed between the pattern search and the pattern inspection.

As in the example of Example 1, in a case where the number of the patterns from an alignment pattern 402 to a hole pattern 403 to be inspected on an observation sample 401 is counted, when a scanning region is scanned with an electron beam in parallel to a moving direction of the scanning region, it is impossible to execute a process such as the pattern count or the like by the image process until imaging of an entire scanning region is completed. In an example illustrated in FIG. 4(a), two hole patterns are included in one imaging region and counting of the number of the patterns by the image process can be performed only by the unit. However, when the scanning region is scanned with the electron beam perpendicularly to the moving direction, a process such as counting of the number of the patterns by the image process can be executed even during imaging of the scanning region.

Figure 4B:
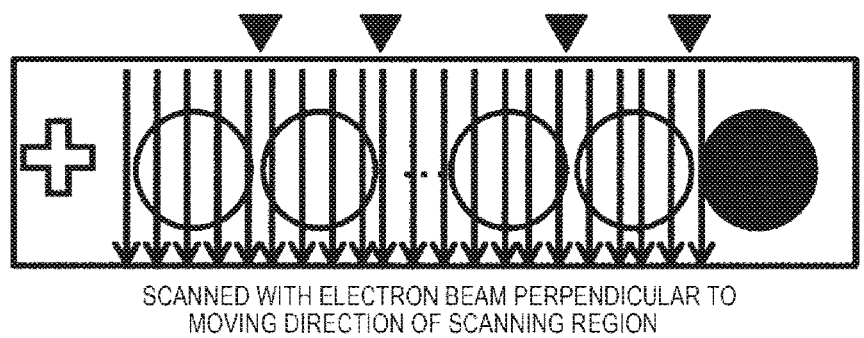

As illustrated in FIG. 4(b), the number of the patterns can be counted each time each hole pattern appears. This means that it is possible to perform feedback control more finely and it is possible to reduce the electron beam irradiation amount to the entire sample.

As described above, in order to measure a dimension of the inspection target pattern in a lateral direction (X-axis direction) with high accuracy, even in a case where the scanning line direction of the inspection image is set in the X-axis direction, immediately after the position of the field of view reaches a predetermined number of patterns, it is possible to perform scanning for measurement by setting the scanning line direction of the image for the pattern count to, for example, a Y-axis direction intersecting the moving direction. Therefore, it is possible to realize reduction of the irradiation amount and high speed of the inspection.

Figure 4C:
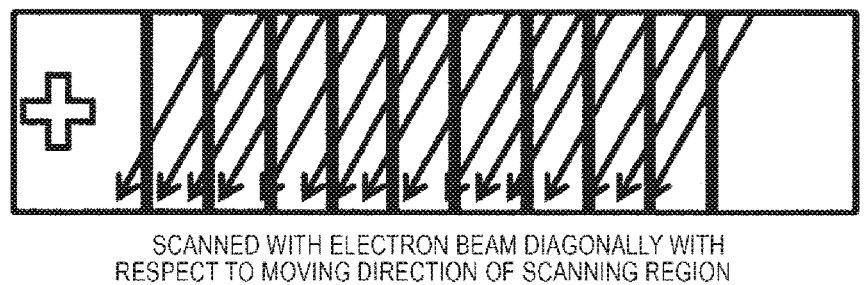

In general, it is known that a high S/N ratio can be obtained by scanning with the electron beam perpendicular to an edge of the pattern. Therefore, in a case of a pattern such as line and space as illustrated in FIG. 4(c), as illustrated in FIG. 4(b), the S/N ratio decreases in a method of being vertically scanned with the electron beam with respect to the moving direction of the scanning region. Therefore, as illustrated in FIG. 4(c), it is possible to achieve both a fine feedback control and a high S/N ratio by scanning with the electron beam diagonally with respect to the moving direction of the scanning region.

As described above, it is possible to realize high speed of the inspection by switching the scanning line direction between the image for inspection and the image for the pattern count.

Example 3

Next, an example, in which an image for the pattern count is acquired in a state where the stage is moved, will be described.

In a case where the place to be inspected is far from the alignment pattern, or the like, and the alignment pattern and the place to be inspected are not accommodated in the field of view in the scanning kind electron microscope, it is necessary to move the field of view by moving the stage. As the moving method of the field of view, as illustrated in FIG. 5, there are roughly two methods. In FIG. 5, a stage moving signal 501 represents a moving speed of the stage and the higher the value, the greater the moving speed of the stage. In addition, in the example of FIG. 5, it is assumed that the moving direction of the stage is fixed to a negative direction of the X direction, that is, to the left in FIG. 5. The Y direction is a vertical direction illustrated in FIG. 4 and if a value of a Y coordinate signal 502 increases, an irradiation position of the electron beam moves downward. The X direction is a horizontal direction illustrated in FIG. 4 and if the value of an X coordinate signal 503 increases, the irradiation position of the electron beam moves to a right direction.

First, as illustrated in FIG. 5(a), it is a method in which imaging is performed in the field of view in a state where a stage 101-6 is stopped. After the imaging is completed, and the field of view is moved by moving the stage 101-6 by the stage moving signal 501.

Second, as illustrated in FIG. 5(b), an image is acquired by the first imaging method while constantly moving the stage 101-6 at a low speed by the stage moving signal 501 and feedback control is performed. In this case, scanning with the electron beam is performed perpendicular to the moving direction of the stage 101-6, that is, in the Y direction so that imaging can be performed without moving the electron beam in parallel direction, that is, the X direction. The stage 101-6 is stopped by the stage moving signal 501 when switching is performed by the second imaging method by the feedback control, and the place to be inspected near a center of the field of view is scanned by the second imaging method to acquire an image. According to the second method, even in a case where a reference pattern such as the alignment pattern and the inspection target pattern are far from each other, it is possible to realize high speed of the inspection based on the search of the pattern based on the pattern count.

Example 4

Next, an example, in which a pattern count is performed by using an image obtained by changing a scanning condition according to the moving direction of the stage.

As illustrated in FIG. 6(a), a pattern 602 to be inspected on an observation sample 601 is at $100^{th}$ in the X direction and $50^{th}$ in the Y direction from an alignment pattern 603. A first condition is the "$100^{th}$ pattern in the X direction from the alignment pattern" and a second condition is the "$50^{th}$ pattern in the Y direction from the alignment pattern". Patterns are scanned until the $100^{th}$ pattern in the X direction and images are acquired by a first imaging method 604.

In this case, a moving direction of an imaging region is the X direction. Next, counting of the number of patterns in the Y direction is performed by a third imaging method 605 while moving the imaging region in the Y direction. At the $50^{th}$ place in the Y direction, the imaging method is switched to a second imaging method 606 to acquire an image. Both the first imaging method and the third imaging method (third irradiation condition) perform beam scanning with a beam of lower dose than that of the second imaging method.

As described above, the user designates a plurality of conditions and switches the imaging method each time, so that the user can inspect a pattern located at a complicated position from the alignment pattern. As a result, as illustrated in FIG. 6(b), an entire image from the alignment pattern 603 to the pattern 602 to be inspected can be acquired and the accuracy increases only at the periphery of the pattern 602 to be inspected. In addition, a large black square in FIG. 6(b) is a region that is not scanned and the region is dark as an image.

Example 5

Figure 7:
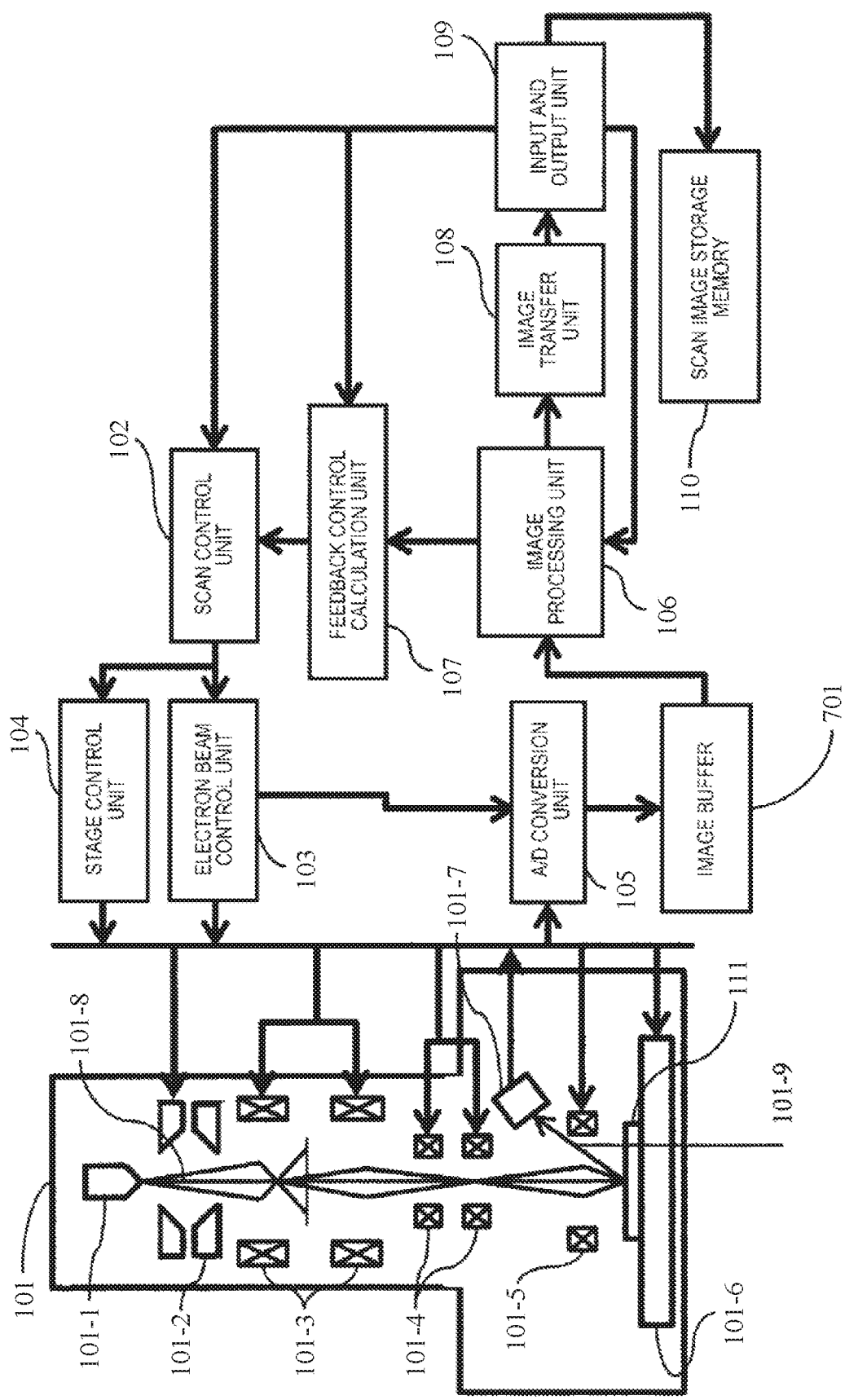
FIG. 7 is a configuration diagram of a scanning kind electron microscope having an image buffer (temporary storage medium).

Hereinafter, a scanning electron microscope including an image buffer for temporarily storing an image will be described with reference to FIG. 7. According to a configuration illustrated in FIG. 7, it is possible to suppress an electron beam irradiation amount with respect to an observation sample 111. In order to suppress the irradiation amount, it is important to perform image recognition and feedback control in real time. However, in a case where a burden of the image process for determining a condition designated by the user is large, the image recognition and the feedback control may not be performed in real time. Therefore, as illustrated in FIG. 7, an image buffer 701 is provided and data sent from an A/D conversion unit 105 is temporarily held in the image buffer 701. An image processing unit 106 extracts image data from the image buffer 701, performs the image process, and dispatches a result to a feedback control calculation unit 107.

Figure 8:
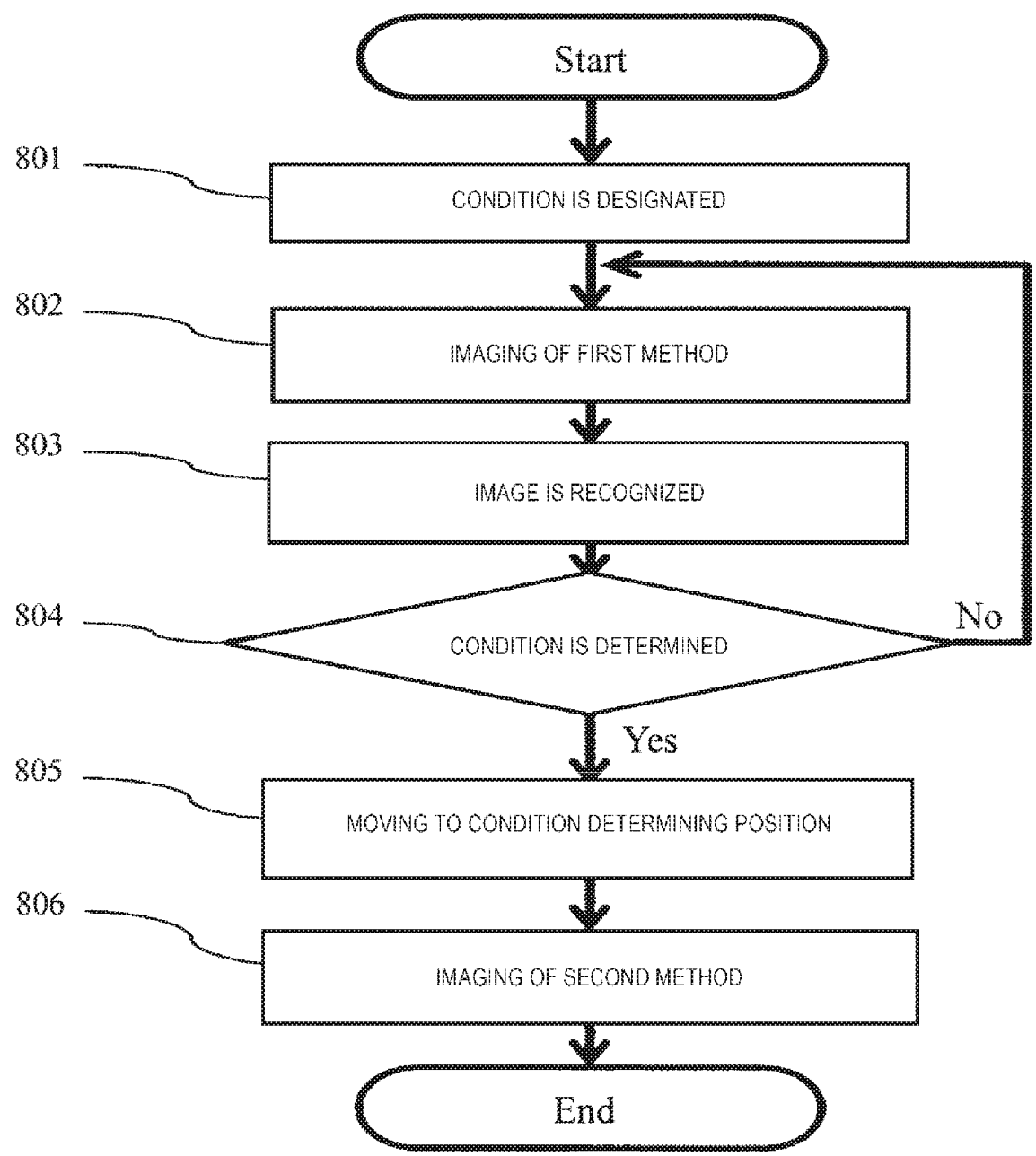
FIG. 8 is a flowchart illustrating a step of performing searching and inspection of a pattern with a scanning kind electron microscope including an image buffer.

FIG. 8 is a flowchart illustrating a pattern searching step using the scanning electron microscope illustrated in FIG. 7. The process from condition designating step 801 to condition determining step 804 is the same as that of the flowchart illustrated in Example 1. In the example, in a case where a determination of Yes is made in the condition determining step 804, a current scanning position is different from a position determined in the condition determining step 804. Therefore, in order to move to the position determined in the condition determining step 804, step 805 for moving to the condition determining position is necessary. After moving to the condition determining position in the step, the process proceeds to imaging step 806 of a second method and an image having high accuracy is acquired. As in the case of FIG. 3(c), an image output to the input and output unit may be an image from an alignment pattern 302 to a periphery of a pattern 304 to be inspected, or may include a rough image ahead of the pattern 304 to be inspected.

Example 6

Figure 9:
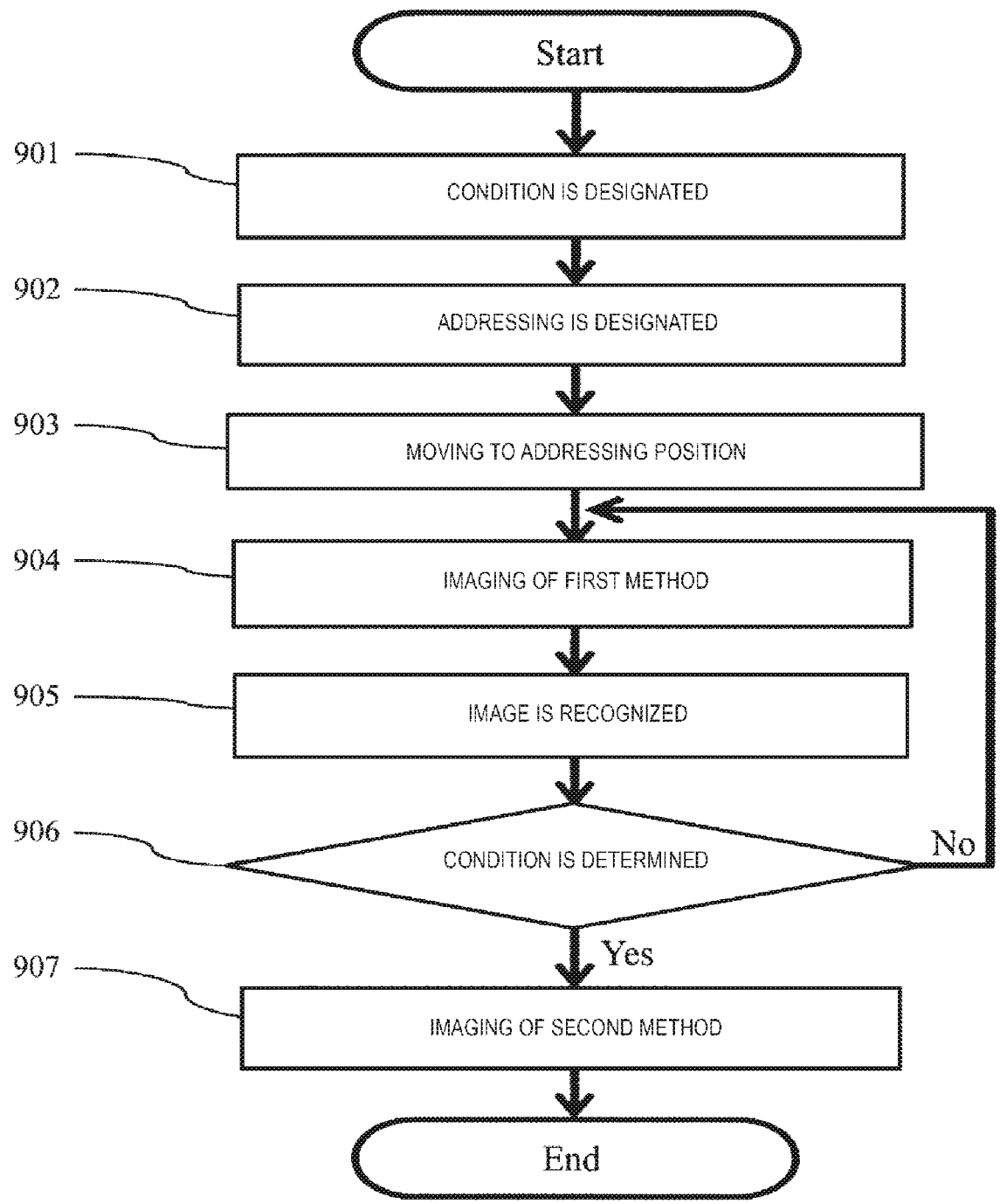
FIG. 9 is a flowchart illustrating a step of performing pattern search using an image obtained based on low dose beam scanning after addressing.

Next, a processing step of pattern searching and performing inspection of the searched pattern as described above through addressing will be described with reference to a flowchart illustrated in FIG. 9. The user performs a condition designating process (step 901) and an addressing designating process (step 902). The order of the two steps may be changed. In addressing designating step 902, there are a method of designating a place from a scan image of low magnification or from an image of an optical microscope, and a method of designating a place from design information. However, in the designated place, it is necessary to include a pattern different from the periphery so as to specify the position. In step 903 of moving to an addressing position, an image is acquired by scanning with the optical microscope or an electron beam of a low magnification and it is determined whether or not the pattern designated in the addressing designating step 902 is included. A scanning start position is determined by the determination result and the process proceeds to imaging step 904 of the first method. The subsequent steps are the same as those of the flowchart illustrated in Example 1.

The addressing is a process of specifying the position of the addressing pattern by searching using an image (template image) of a pattern which is previously registered as the addressing pattern from the image of a low magnification (wide range image). The field of view is positioned in a region including the inspection target pattern by specifying the position of the addressing pattern and positioning the field of view in the scanning kind electron microscope on the inspection target pattern that is in a known positional relationship with the specified addressing pattern. As described above, in such an inspection involving an automatic pattern search by addressing, once the addressing pattern is found, the stage and the deflector for moving the field of view are controlled by using known information (distance between previously registered addressing pattern and the inspection target pattern, and relative positional relationship between a current beam irradiation position and the addressing pattern). However, in a case of the example, after a first pattern search process such as addressing, a second pattern search process for searching a pattern by the pattern count is performed. In order to appropriately perform a process of finding a target pattern through such a two-stage pattern search process, it is desirable that the magnification of the image used for the second pattern search process is set so that at least the addressing pattern and a pattern to be counted closest to the addressing pattern fall within one field of view. Therefore, it is desirable to form the addressing pattern in the vicinity of a formation region of a repetitive pattern including the pattern that is the inspection target.

Example 7

Figure 10:
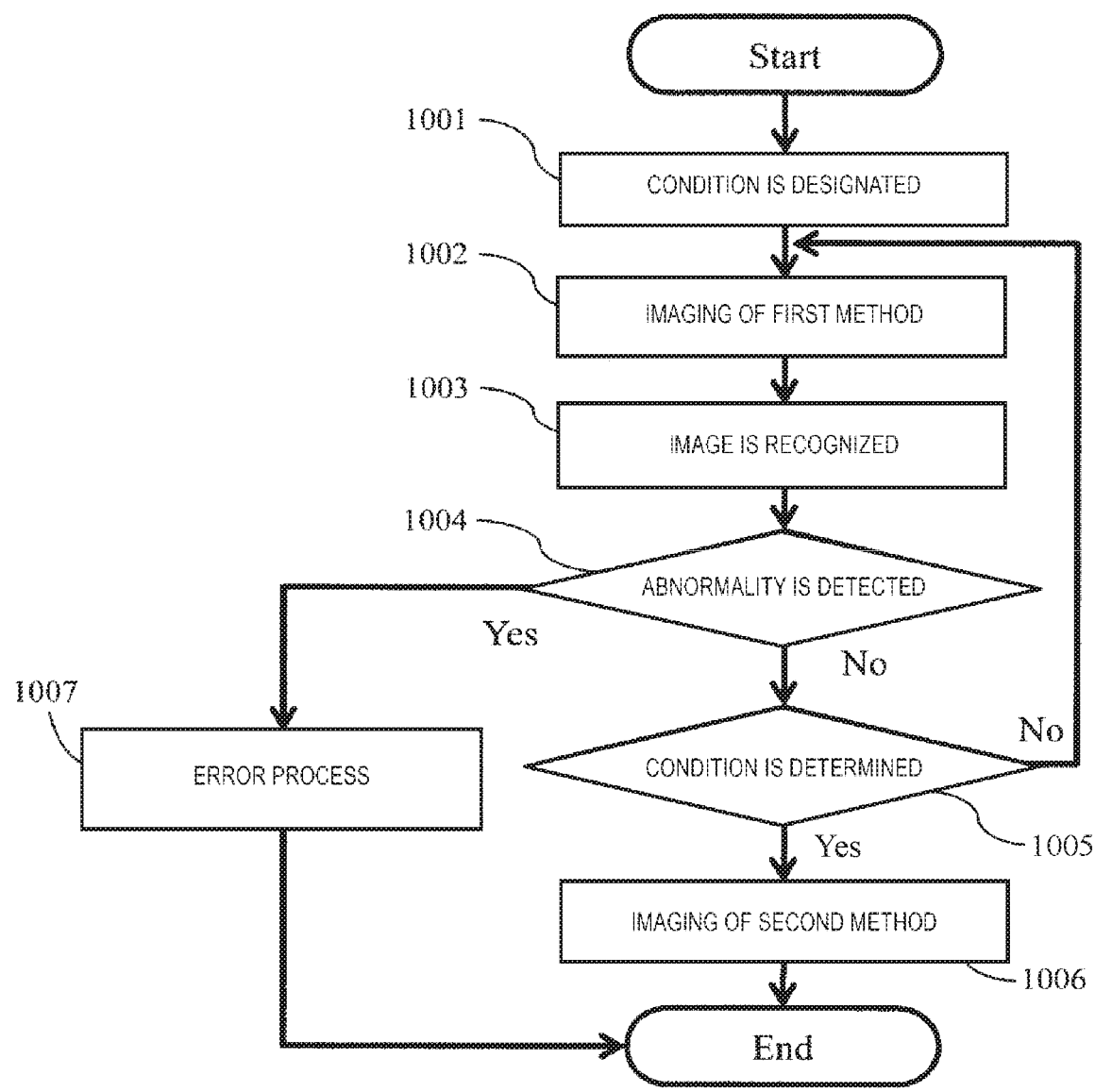
FIG. 10 is a flowchart illustrating a step of performing an error process when an abnormality is detected during the pattern search.

Next, a pattern search process for detecting abnormality at the time of pattern search and changing a subsequent process depending on presence or absence of the abnormality will be described. When the first imaging or the second and subsequent imaging process described above are performed, an error such as a pattern cannot be recognized may occur. For example, it is conceivable that appropriate pattern count cannot be performed due to a lot of noise and the lowered S/N ratio and as a result, the movement of the field of view cannot be appropriately performed. For example, it is conceivable a case in which a portion without a pattern is scanned by scanning a position deviated from an original scanning position. In the search algorithm illustrated in the example, even if the portion without the pattern is repeatedly scanned in a predetermined direction, a predetermined condition (for example, 100 patterns are counted) cannot be satisfied, so that an unnecessary search process may be performed. This results in a decrease in throughput and an increase in the electron beam irradiation amount to the sample. Therefore, as illustrated in FIG. 10, abnormality detecting step 1004 is provided before condition determining step 1005. The abnormality detecting step 1004 may be performed after being determined as No in the condition determining step 1005.

In the abnormality detecting step 1004, in a case of satisfying a condition such as a case where a pattern is not included in a result of image recognition or the S/N ratio is equal to or less than a certain value, the process proceeds to error processing step 1007. In the error processing step, a warning message is issued on a GUI screen of an input and output unit 109 or the like to inform the user of the abnormality and imaging is automatically stopped. In addition, a warning may be issued to the user without stopping imaging in the error processing step 1007. In this case, imaging 1002 of the first method is continuously executed.

Example 8

As illustrated in Example 1, in a case where the inspection target pattern is searched by performing the count of the pattern, when scanning is performed by the first imaging method, the S/N ratio is sufficiently high and the number of patterns can be counted, but correct measurement cannot be performed in some cases as a result. For example, as illustrated in FIG. 11(a), in a case where a pitch between patterns on an image 1101 obtained by the first imaging method is abnormally large only partially, or as illustrated in FIG. 11(b), a center position of the pattern may deviate. In a case of FIG. 11(a), there is a possibility that the pattern itself is abnormal in an abnormal pitch portion 1102, or there is a possibility that recognition of the pattern cannot be performed only for the place. Even if an image having high accuracy is obtained by recognizing the $100^{th}$ pattern in the image recognition, it is not known whether the $100^{th}$ pattern can be truly inspected. In a case of FIG. 11(b), it is conceivable that there is abnormality in the pattern or abnormality in the moving direction of the scanning region, and if the scanning is continued as it is, there is a possibility that a pattern of one row above is inspected.

Therefore, it is necessary to warn the user or stop the scanning by detecting such abnormality. In image recognizing step 1003 illustrated in FIG. 10, the pitch between the patterns and the center position are obtained, and in abnormality detecting step 1004, it is determined that there is no large deviation between design information and information on a pitch interval obtained from an average of ranges imaged up to now, and thereby it is possible to detect the abnormalities. In a case where an abnormality is detected, an error process (step 1007) such as issuing a warning message on the GUI of the input and output unit 109 or stopping the scanning is performed.

Example 9

In the examples described above, the pattern searching process for outputting the line width of the pattern and the hole diameter that are the inspect targets is described. However, as described in Example 1, for example, it is possible to see an entire image 1201 that is imaged with an image display region included in a GUI screen illustrated in FIG. 12. It is possible to calculate, for example, from the entire captured image data 1201, a pitch 1202 and an average pitch between patterns a distance 1205 from an alignment pattern 1203 to a pattern 1204 to be inspected, a displacement amount 1206 of the position of each pattern, or the like.

The pitch 1202 can be calculated, for example, by identifying the pattern and the luminance of pixels in the other regions based on the binarization of the image, obtaining a center of gravity of the pattern, and obtaining a distance between centers of gravity. In addition, the deviation amount can be obtained by obtaining an average coordinate (position) of the position of the center of gravity of each pattern in a longitudinal direction (Y direction) of a paper surface and a difference from the average coordinate can be defined as the deviation amount.

Figure 12:
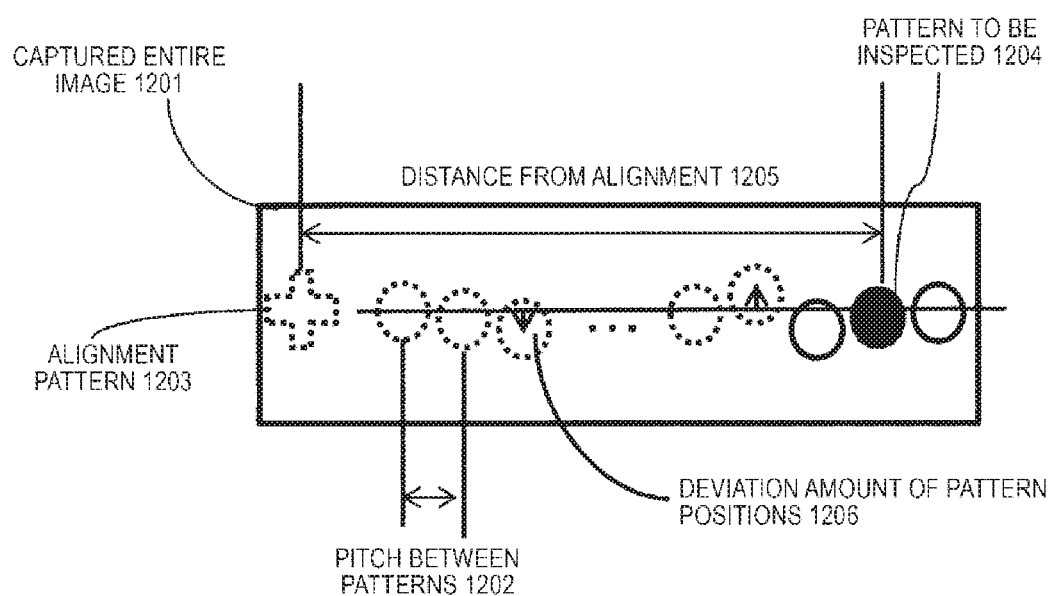
FIG. 12 is a view illustrating an example of a pattern search image.

The pitch 1202 between the patterns, the deviation amount 1206 of the pattern position, or the like may be calculated in advance in the abnormality detecting step 1004 illustrated in Example 7. As illustrated in FIG. 12, the user can obtain additional information about the captured image at a glance by displaying the calculation results so as to be superimposed on the captured entire image 1201 on the GUI. In addition, these information can easily be changed on display/non-display by an operation on the GUI.

Example 10

Next, a process of specifying a kind of a pattern formed by a manufacturing process having a plurality of exposing processes such as Self Aligned Double Patterning (SADP) will be described. In the SADP, there are two kinds of gaps called a core gap and a spacer gap. Since the two gaps are generated in different manufacturing steps, feedback to an appropriate manufacturing process can be made by accurately specifying the kind of the gap and performing inspection and measurement of a specific pattern. That is, if it is known that what kind gap is the inspected gap, it is possible to be used for analysis to improve yield.

An inspecting step of executing inspection and measurement of a desired pattern by performing the pattern count and performing gap determination will be described with reference to FIG. 9. First, in condition designating step 901, the number of gaps to be inspected is designated. Next, in addressing designating step 902, an alignment pattern close to the gap to be inspected is designated from the design information. In this case, information about what kind of gap is closest to the alignment pattern is specified from the design information. Next, an imaging region is moved to the alignment position and scanning is performed in the imaging step 904 of the first method.

In imaging recognizing step 905, the number of gaps is counted from the acquired image. Here, it is determined that what kind of gap each gap is with respect to the counted gaps. In the SADP, since the core gap and the spacer gap are alternately arranged, in a case where the gap closest to the alignment pattern is the core gap, odd-numbered gaps are the core gaps and even-numbered gaps are the spacer gaps. It is possible to superimpose and display the kind of gap of the inspected gap when a result image is output on the GUI by dispatching these information to the input and output unit 109 via the image transfer unit 108. In addition, the determination of the kind of the gap may be performed on the GUI of the input and output unit 109. As a result, the user can know what kind gap the inspected gap is at a glance.

Moreover, the pattern generated by the SADP may be difficult to identify not only between gaps but also between a line pattern and a gap. This is because the luminance difference between the line and the gap is small, it is sometimes difficult to identify both. On the other hand, in an edge portion, many secondary electrons are emitted due to an edge effect and the luminance is high, so that it is easy to identify the edge and the line, or the gap. That is, although it is possible to specify a region of the line or the gap, it may be difficult to identify whether it is a line or a gap. Therefore, in the example, it is determined whether the core gap or the spacer gap is present, and an $m^{th}$ pattern that is a desirable measurement target is specified based on the pattern count. For example, in a case of being arranged like the line pattern, the core gap, the line pattern, the spacer gap, the line pattern, the core gap, the line pattern, the spacer gap, the line pattern, . . . , patterns of which the count number is positioned at 2, 6, 10, 14 . . . from an end of the pattern forming region are identified as the core gaps and patterns of which the count number is positioned at 4, 8, 12, 16 . . . are identified as the spacer gaps. In addition, for example, in a case where $m^{th}$ core gap is specified, the order is specified and it is determined whether or not it is the desired m by solving $m=(n+2)/4$ (n is the number of counts). In addition, in a case where $m^{th}$ spacer gap is specified, the order is specified and it is determined whether or not it is the desired m by solving $m=n/4$.

After the field of view reaches a desired gap in the desired order, it is possible to accurately specify a desired inspection target pattern and generate an image having high resolution while reducing irradiation beam amount with respect to the sample by scanning a high dose beam.

REFERENCE SIGNS LIST

101 ... electron microscope, 101-1 ... electron source, 101-2 ... acceleration electrode, 101-3 ... focusing lens, 101-4 ... deflection coil, 101-5 ... objective lens, 101-6 ... stage, 101-7 ... detector, 101-8 ... primary electron beam, 101-9 ... emission electron, 102 ... scan control unit, 103 ... electron beam control unit, 104 ... stage control unit, 105 ... A/D conversion unit, 106 ... image processing unit, 107 ... feedback control calculation unit, 108 ... image transfer unit, 109 ... input and output unit, 110 ... scan image storage memory, 111 ... observation sample

The invention claimed is:

1. A charged particle beam apparatus comprising:
    a deflector that deflects a charged particle beam emitted from a charged particle source;
    a charged particle beam source configured to generate a charged particle beam;
    a stage that moves a sample that is an irradiation target of the charged particle beam;
    a set of charged particle-optical elements configured to switch the charged particle beam between a first dose amount and a second dose amount, wherein the second dose amount is greater than the first dose amount, wherein the set of charged particle-optical elements includes the deflector;
    a detector configured to detect charged particles generated based on irradiation of the sample with the charged particle beam; and
    an image processing unit configured to generate a first image based on an output of the detector, count a number of objects included in the first image formed by irradiating the sample with the charged particle beam with the first dose amount, and in a case where the number of the objects reaches a predetermined value, generate a second image by irradiating the sample with the charged particle beam with the second dose amount;
    a scan control unit programmed to control the deflector and the stage, such that at least one of the stage and the deflector is controlled so as to move a field of view from a reference position to an inspection or measurement target pattern;
    wherein the set of charged particle-optical elements is configured to switch the charged particle beam from the first dose amount to the second dose amount when the number of objects included in the first image reaches the predetermined value.

2. The charged particle beam apparatus according to claim 1,
    wherein the scan control unit is further programmed to repeat generation of a plurality of adjacent images by scanning with the charged particle beam of the first dose amount until the number of the objects reaches the predetermined value.

3. The charged particle beam apparatus according to claim 1,
    wherein the scan control unit is further programmed to change scanning directions of the charged particle beam of the first dose amount and the charged particle beam of the second dose amount.

4. The charged particle beam apparatus according to claim 3,
    wherein the scan control unit is further programmed to control scanning with the charged particle beam so that scanning lines of the charged particle beams intersect with each other in a moving direction of the field of view.

5. The charged particle beam apparatus according to claim 1,
    wherein the scan control unit is further programmed to scan with the charged particle beam of the first dose amount while moving the stage to generate the first image.

6. The charged particle beam apparatus according to claim 1,
    wherein the scan control unit is further programmed to count the number of the objects included in the first image obtained by scanning with the charged particle beam of the first dose amount, control at least one of the stage and the deflector so that the field of view is moved toward the inspection or measurement target pattern in a case where the number of the objects reaches the predetermined value, and generate a third image based on scanning with a charged particle beam of a third dose amount which is a lower dose than the second dose amount.

7. The charged particle beam apparatus according to claim 1,
    wherein the scan control unit is further programmed to control scanning a position of the field of view including an alignment pattern provided at the reference position with the charged particle beam of the first dose amount.

* * * * *